United States Patent
Nakajima et al.

[11] Patent Number: 5,858,103
[45] Date of Patent: Jan. 12, 1999

[54] VERTICAL WAFER BOAT

[75] Inventors: Toshio Nakajima; Hisao Yamamoto, both of Takasago, Japan

[73] Assignee: Asahi Glass Company Ltd., Tokyo, Japan

[21] Appl. No.: 855,950

[22] Filed: May 14, 1997

[30] Foreign Application Priority Data

May 17, 1996 [JP] Japan .................................. 8-148145

[51] Int. Cl.⁶ .................................................. C23C 16/00
[52] U.S. Cl. ........................ 118/728; 118/500; 117/200; 206/710; 206/832; 211/41.18; 414/935; 414/938
[58] Field of Search .................................. 206/710, 832; 211/41.18; 414/935, 938; 118/500, 728; 117/200

[56] References Cited

U.S. PATENT DOCUMENTS

| | | | |
|---|---|---|---|
| 4,872,554 | 10/1989 | Quernemoen | 206/454 |
| 5,482,559 | 1/1996 | Imai | 118/728 |
| 5,492,229 | 2/1996 | Tanaka | 211/41 |
| 5,534,074 | 7/1996 | Koons | 118/728 |
| 5,638,958 | 6/1997 | Sanchez | 206/710 |

FOREIGN PATENT DOCUMENTS 0 506 052   9/1992   European Pat. Off. .

OTHER PUBLICATIONS

Patent Abstracts of Japan, vol. 095, No. 003, Apr. 28, 1995, JP-A-06 349758, Dec. 22, 1994.
Patent Abstracts of Japan, vol. 095, No. 001, Feb. 28, 1995, JP-A-06 302680, Oct. 28, 1994.
Patent Abstracts of Japan, vol. 017, No. 130 (M–1382), Mar. 18, 1993, JP-A-04 310373, Nov. 2, 1992.
Patent Abstracts of Japan, vol. 095, No. 009, Oct. 31, 1995, JP-A-07 147258, Jun. 6, 1995.
Patent Abstracts of Japan, vol. 013, No. 026(E–706), Jan. 20, 1989, JP-A-63 228611, Sep. 22, 1988.
Patent Abstracts of Japan, vol. 014, No. 312 (E–0948), Jul. 5, 1990, JP-A-02 102524, Apr. 16, 1990.
Patent Abstracts of Japan, vol. 016, No. 375 (C–0973), Aug. 12, 1992, JP-A-04 120000, Apr. 21, 1992.
Patent Abstracts of Japan, vol. 018, No. 477 (E–1602), Sep. 6, 1994, JP-A-06 163439, Jun. 10, 1994.

*Primary Examiner*—Robert Kunemund
*Attorney, Agent, or Firm*—Oblon, Spivak, McClelland, Maier & Neustadt, P.C.

[57] ABSTRACT

A radius of 0.1–1 mm is provided at a corner between a bottom of each of semiconductor wafer inserting and supporting grooves and a base of a supporting piece between the supporting groove and a supporting groove adjacent thereto, which are formed in bars connecting upper and lower end plates of a vertical wafer boat.

10 Claims, 3 Drawing Sheets

VERTICAL WAFER BOAT

The present invention relates to a vertical wafer boat which is used to support semiconductor wafers when the semiconductor wafers are put into a vertical heat treatment furnace such as a low pressure CVD (chemical vapor deposition) system.

Semiconductor wafers are put into various kinds of heat treatment furnaces for treatment such as oxidation, diffusion and thin film deposition. A wafer boat has been used as a supporting tool to support numbers of semiconductor wafers for entry into and take out from a heat treatment furnace.

It is known that such a wafer boat is classified according to the structure of heat treatment furnaces into a horizontal boat for entry of semiconductor wafers into and take out from a furnace through a lateral side of the furnace, and a vertical boat for entry of semiconductor wafers into and take out from a furnace through an upper end or a lower end of the furnace. Those wafer boats are made of quartz or high-purity silicon carbide, and have supporting grooves formed therein to receive and support numbers of the wafers.

Since the horizontal boats support the wafers side by side in a lateral direction with the surfaces of the wafers vertically oriented, the horizontal boats are not required to have the supporting grooves deeply formed therein, and the wafers little flex.

Although the vertical boats have an advantage in that they can support and treat semiconductor wafers having a greater diameter in comparison with the horizontal boats, the vertical boats have created problems in that the wafers are apt to flex and therefore introduce dislocation. This is because the vertical boats catch peripheral edges of the wafers by the supporting grooves and support the wafers one above another in the vertical direction with the surfaces of the wafers horizontally oriented. The vertical boats have created another problem in that the supporting pieces for supporting the wafers should be made thinner due to a demand for a wider space in each of the supporting grooves for easy take-in and take-out of the wafers, and the supporting pieces are fragile in groove machining.

It is dominant that the wafer boats are made of silicon carbide which is superior in strength and resistance to heat and corrosion in comparison with quartz. The wafer boats which are made of silicon carbide are produced by carrying out machining for e.g. supporting groove formation after shaping a material including silicon carbide powder and a binder, firing the shaped material and impregnating silicon into the fired material.

It is desired that supporting surfaces for the wafers are as large as possible to deepen the supporting grooves so as to prevent the wafers from being cantilevered in order to avoid the flexure of the wafers and the occurrence of dislocation. In addition, it is desired that the distance between adjoining supporting grooves is narrowed in order to treat as many semiconductor wafers as possible at the same time.

However, it is necessary to carry out groove machining by use of e.g. a diamond blade in order to provide, with high accuracy, the supporting grooves for a wafer boat which is made of a material prepared by impregnating silicon into a sintered article of silicon carbide. The deeper the supporting grooves are, and the narrower the distance between adjoining supporting grooves is, the more difficult the groove machining is. This has created a problem is that there is a strong possibility that the supporting pieces formed in a comb-teeth shape are fractured during machining, and product yield is low.

The wafer boats are required to be occasionally cleaned by e.g. acid cleaning in order to prevent impurities from contaminating the wafers. When the supporting grooves are deep, and the distance between adjoining supporting groove is narrow, the supporting pieces are frequently fractured during cleaning operation.

It is also desired that the wafers are supported at their peripheral portions to minimize contacting areas so as to be prevented from being contaminated by e.g. fine particles. If the wafer boat is prepared to have the supporting pieces tapered in section, there is created a problem in that it is impossible to provide tapered grooves because a diamond blade generates a force to fracture the supporting pieces by a wedge effect during preparation of the tapered grooves.

In case of provision of a shape difficult to be machined, the surfaces of the supporting grooves to be machined could be made rough, or the blade could swell to make the flatness of the surfaces of the supporting grooves worse. In these cases, the surfaces of the wafers could be damaged.

It is an object of the present invention to provide a vertical wafer boat capable of improving the strength of comb-teeth shaped supporting pieces to deepen the depth of supporting grooves and narrow the distance between adjoining supporting grooves, and of offering increased production yield.

According to a first aspect of the present invention, there is provided a vertical wafer boat which comprises a pair of end plates arranged at an upper position and a lower position; a plurality of bars connecting the end plates; supporting grooves formed in the bars at predetermined distances to receive and support semiconductor wafers; and comb-teeth shaped supporting pieces, each being provided between adjoining supporting grooves; wherein the end plates, the bars, the supporting grooves and the supporting pieces are made of a material including silicon carbide as a main component, and a corner between a bottom of each of the supporting grooves and a base of the supporting piece adjoining thereto is rounded with a radius of 0.1–1 mm.

According to a second aspect of the present invention, the vertical wafer boat is prepared so that when the supporting pieces have a thickness of a mm, and the supporting grooves have a depth of b mm and a vertical space of c mm, there is a relation of $(b/a) \times c > 10$ mm.

According to a third aspect of the present invention, the vertical wafer boat is prepared so that when the supporting grooves have a depth of b mm, and a length which is obtained by subtracting the depth of the supporting grooves from a bar thickness is d mm, there is a relation of $b > d$.

According to a fourth aspect of the present invention, the vertical wafer boat is prepared so that the supporting grooves have an inner wall with a surface roughness of not greater than 100 $\mu$m, or a flatness of not greater than 0.1 mm. The surface roughness represents a value of $R_y$ which is measured according to the prescription defined in Japanese Industrial Standard JIS B0601. The flatness represents a value which is measured according to the prescription defined in Japanese Industrial Standard JIS B0621.

In the vertical wafer boat according to the first aspect, it is preferable that the radius is 0.2–0.7 mm.

According to a fifth aspect of the present invention, the vertical wafer boat is prepared so that the supporting pieces are formed in a tapered shape in section that provides a cone angle of $\frac{1}{500} - \frac{1}{20}$.

In accordance with the first aspect of the present invention, the corner between the bottom of each of the supporting grooves and the base of the supporting piece adjoining thereto is rounded with a radius of 0.1–1 mm. Even if the supporting grooves are deep, and the distance between adjoining supporting grooves is narrow, i.e. the supporting pieces are thin, stress is prevented from centering on the base of the supporting piece to make fracture in the supporting piece difficult. As a result, it is possible not only to facilitate groove machining by use of e.g. a grindstone to improve machining yield but also to minimize fracture in the supporting piece in use.

In accordance with the second aspect of the present invention, the depth b of the supporting grooves is large, and the thickness a of the supporting pieces is small. Semiconductor wafers can be deeply inserted so that the center of gravity of each of the wafers is located inside imaginary polygons defined by lines connecting supporting points. As a result, supporting surfaces for the wafers can be made wide to restrain dislocation due to flexure of a semiconductor wafer, and enable supporting the wafers in great numbers at the same time. Although great stress generates at the bases of the supporting pieces during machining or cleaning when the thickness of the supporting pieces is small in comparison the depth of the supporting grooves, the provision of the radius at the corner between the bottom of each of the supporting grooves and the base of the supporting piece adjoining thereto can distribute the stress to avoid fracture.

According to the third aspect of the present invention, the depth of the supporting grooves is large in comparison with the thickness of the bars. As a result, it is possible to deepen the supporting grooves without increasing the weight or the outer diameter of the wafer boat. Although the supporting pieces are extremely apt to be fractured during machining or cleaning when the depth of the supporting grooves is beyond half of the thickness of the bars, the provision of such a radius at the bases of the supporting pieces can distribute the stress to avoid fracture.

In accordance with the fourth aspect of the present invention, such a lowered surface roughness of the inner wall of the supporting grooves can prevent the wafers from being scratched when the wafers get in touch with the supporting grooves, or such a good flatness allows the wafers to get in uniform contact with the inner walls of the supporting grooves to provide uniform support. The surface roughness of the inner wall of the supporting grooves is preferably not greater than 30 μm.

In accordance with the fifth aspect of the present invention, the supporting pieces are formed in a tapered shape in section. When the wafer boat has a surface coated with a silicon carbide film by use of a CVD technique, a reaction gas can easily spread everywhere on the wafer boat to uniformly deposit the CVD film on the surfaces of the supporting pieces, i.e. the inner walls of the grooves. The wafers can be easily inserted into the supporting grooves because the supporting grooves are gradually opened outwardly. A decrease in contacting areas can minimize contamination due to deposition of e.g. fine particles on the wafers.

In Drawings.

Figure 1:
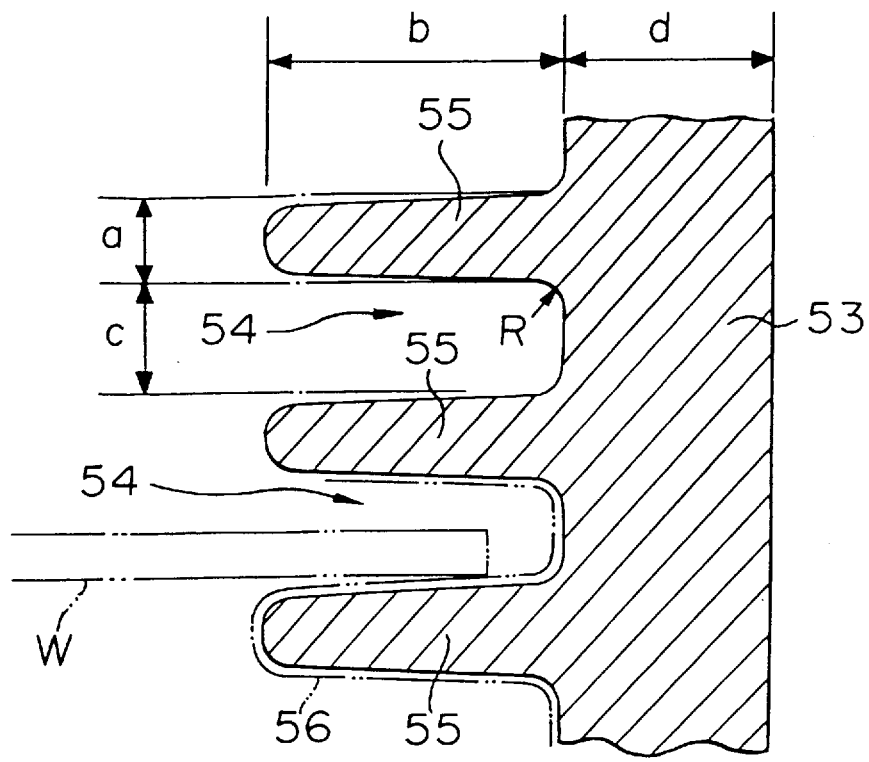
FIG. 1 is an enlarged cross-sectional view of some supporting grooves in the vertical wafer boat according to an embodiment of the present invention.
Figure 3:
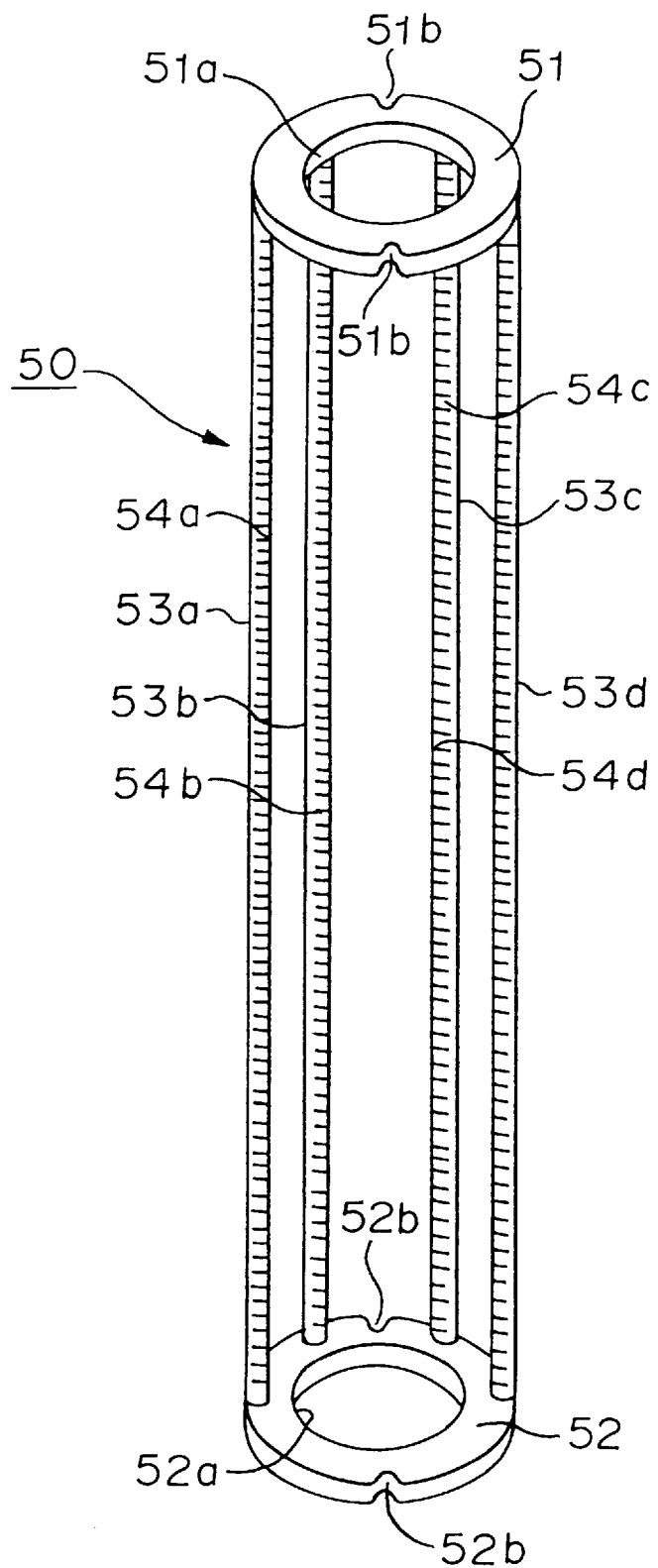
FIG. 3 is a perspective view showing an example of the vertical wafer boat of the present invention.
Figure 4:
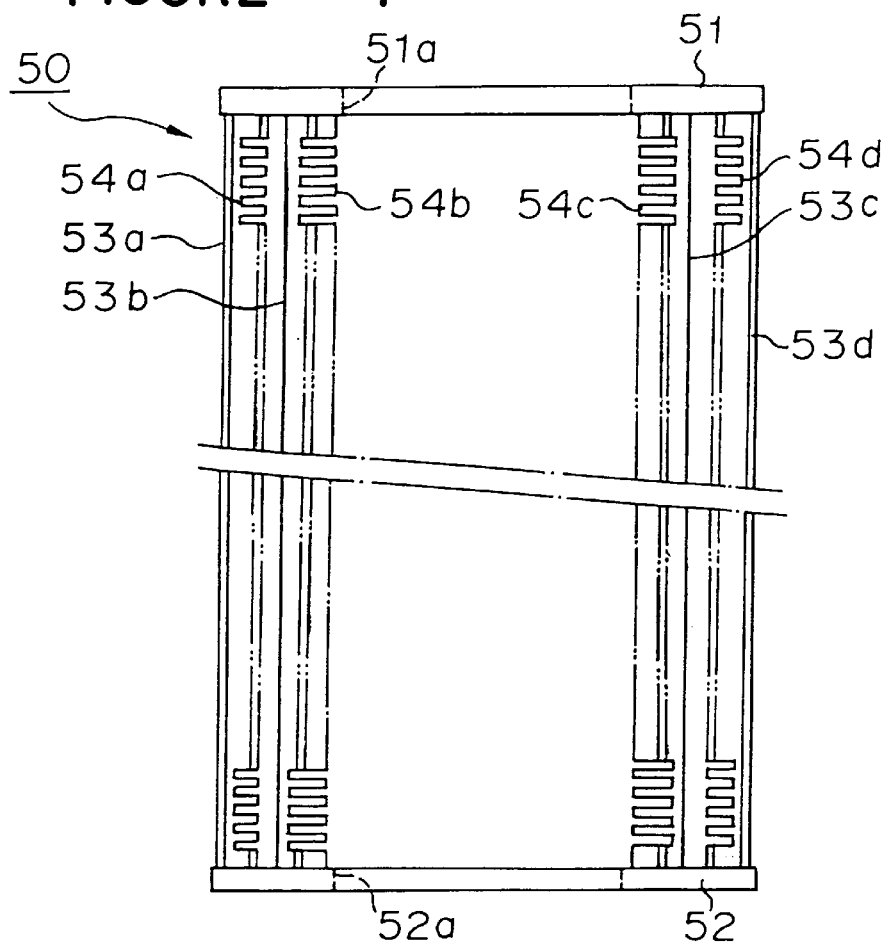
FIG. 4 is a front view of the vertical wafer boat shown in FIG. 3.
Figure 5:
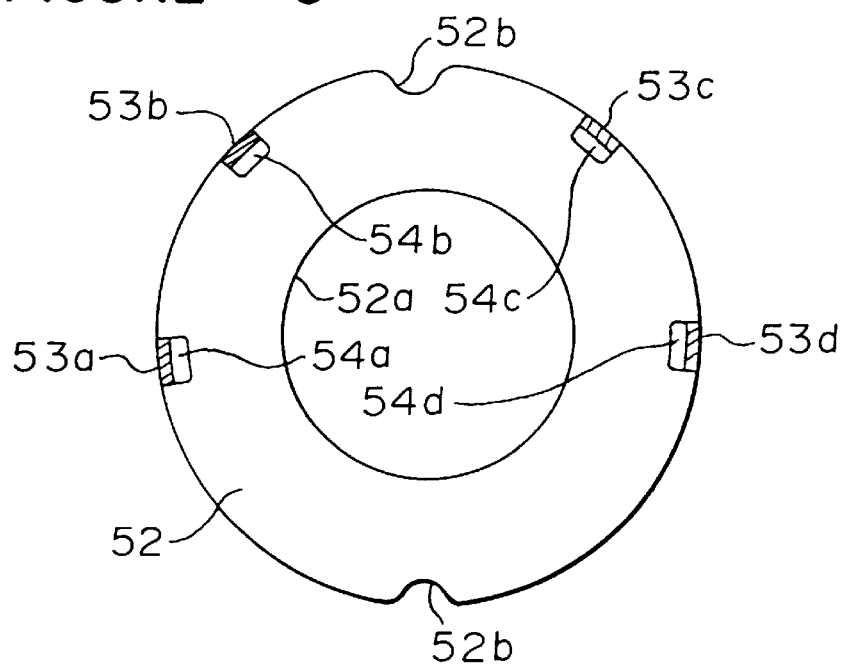
FIG. 5 is a horizontal cross-sectional view of the vertical wafer boat shown in FIG. 3.

In FIGS. 1 and 3–5, there are shown vertical boats according to embodiments of the present invention. In FIG. 1, there is shown an enlarged cross-sectional view of some supporting grooves. In FIG. 3, there is shown a perspective view of an example of the wafer boat. In FIG. 4, there is shown a front view of the wafer boat shown in FIG. 3. In FIG. 5, there is shown a horizontal cross-sectional view of the wafer boat shown in FIG. 3.

As shown in FIGS. 3–5, the vertical wafer boat 50 includes a pair of annular end plates 51, 52 arranged at an upper position and a lower position, and a plurality of bars connecting the end plates 51, 52, that is to say four bars 53a, 53b, 53c, 53d in the shown example. These elements are all prepared by impregnating silicon into fired articles of silicon carbide or coating the surfaces of the fired articles with a CVD film of silicon carbide.

The upper end plate 51 and the lower end plate 52 have respective central portions formed with openings 51a, 52a, and the openings have arced notches 51b, 52b formed on peripheral surfaces at two opposite locations. The openings 51a, 52a are provided for the purpose of making the boat lighter and a flow of e.g. a reaction gas smooth. Although the notches 51b, 52b are used for alignment when the wafer boat is set in a low pressure CVD system, the alignment may be carried out by using e.g. apertures formed in the end plates 51, 52 at a plurality locations.

The bars 53a, 53b, 53c, 53d are jointed to the end plates 51, 52 along outer peripheries thereof at predetermined distances so that semiconductor wafers can be inserted laterally. The bars 53a, 53b, 53c, 53d have numbers of supporting grooves 54a, 54b, 54c, 54d formed therein at respective corresponding positions in height at predetermined pitches from an upper position to a lower position in order to receive and support the semiconductor wafers. Numbers of the semiconductors wafers not shown are inserted into and supported by the supporting grooves 54a, 54b, 54c, 54d from the top to the bottom. The bars are arranged so that the center of gravity of each of the wafers is located inside imaginary polygonals defined by lines connecting supporting points by the supporting grooves. When the center of gravity is near to the center of each of the polygonals, bending stress applied to the wafers can be decreased to make the occurrence of dislocation difficult.

Heat adiabatic plates made of silicon carbide etc. or dummy wafers which are not shown are inserted into several supporting grooves 54a, 54b, 54c, 54d near to the upper and lower ends, and the semiconductor wafers are inserted into supporting grooves other than the grooves near to the upper and lower ends where e.g. a temperature condition is unlikely to be constant. The supporting grooves which are located near to the upper and lower ends for receiving the dummy wafers and the heat adiabatic plates and which are irrelevant to dislocation may be different from the other supporting grooves in terms of groove width, groove depth or dimensional accuracy.

The thickness of the bars 53a, 53b, 53c, 53d is set to provide sufficient strength, depending on the size of semiconductor wafers, the depth of the grooves, the height of the wafer boat and so on. Usually, it is preferable that the respective bars have a cross-sectional area of 65–250 mm$^2$. It is preferable that the vertical wafer boat 50 has an entire length of about 800–1,300 mm to enable treatment of as many as semiconductor wafers at the same time.

In the enlarged cross-sectional view of FIG. 1, there is shown the cross-sectional shape of the supporting grooves 54a, 54b, 54c, 54d (the grooves generically indicated by reference numeral 54 in FIG. 1) which are formed in the bars 53a, 53b, 53c, 53d (the bars generically indicated by reference numeral 53 in FIG. 1).

Comb-teeth shaped supporting pieces 55 are provided to have each of the supporting pieces located between adjoining supporting grooves 54. In accordance with the present invention, it is preferable that the bases of the supporting pieces have a thickness of a mm, the supporting grooves have a depth of b mm, and the space at of the bottoms (groove width) of the supporting grooves 54 is c mm, there is a relation of (b/a)×c>10 mm. When the supporting pieces and the supporting grooves have such a relation, semiconductor wafers W can be prevented from flexing. Greater numbers of semiconductor wafers can be supported by narrowing the insertion space of the wafers W in a vertical direction.

It is preferable that when the supporting grooves have a depth of b mm, and a length which is obtained by subtracting the depth of the supporting grooves from a bar thickness is d mm, there is a relation of b>d. When the supporting grooves and the bars have such a relation, it is possible to deepen the supporting grooves without making the bars thicker, i.e. introducing an increase in the weight of the wafer boat 50.

Even in wafer boats constructed as stated earlier, the supporting pieces 55 are fragile and yield is extremely low when the supporting grooves 53 are ground by use of e.g. a diamond blade. In accordance with the present invention, the corner between the bottom of each of the supporting grooves and the base of the supporting piece adjoining thereto is rounded with a radius R of 0.1–1 mm, preferably 0.2–0.7 mm by, for example, providing an edge of the blade with a radius. By such arrangement, stress can be prevented from concentrating on the base of each of the supporting pieces 55 to make fracture in the supporting pieces 55 difficult, improving yield. If the value indicative of the radius is too small, no sufficient effect is obtained. If it is too large, a wafer could fall out, or bending stress applied to a wafer become too large. It is not preferable that the value is too small or too large.

In accordance with the present invention, it is preferable that the inner wall of each of the supporting grooves, i.e. the upper and lower surfaces of each of the supporting pieces 55 has a surface roughness of not greater than 100 μm. The presence of such a surface roughness can prevent semiconductor wafers W from being scratched when the wafers get in touch with the supporting grooves 54. When the upper and lower surfaces of the each of the supporting pieces has a flatness of not greater than 0.1 mm, the semiconductor wafers can get in uniform touch with the inner wall of each of the supporting grooves to be uniformly supported.

Obtaining such a surface roughness or a flatness is difficult with respect to a wafer boat with the spaces enlarged c because grinding by a blade vibrates the supporting pieces 55. However, in accordance with the present invention, the provision of the radius at the corner between the base of each of the supporting grooves 54 and the base of the supporting pieces 55 adjoining thereto can restrain the supporting pieces 55 from being vibrated or shaked in grinding by a blade to carry out machining with such a surface roughness or a flatness.

In the embodiment shown in FIG. 1, the supporting pieces 55 are formed in a tapered shape in section that provides a cone angle of 1/500–1/20. When e.g. a CVD film 56 of silicon carbide is coated on the surface of the wafer boat, the tapered supporting pieces 55 allow the film 56 to be uniformly coated. The tapered supporting pieces also allow the semiconductor wafers W to be easily inserted into the supporting grooves. The tapered supporting pieces 55 can reduce contacting areas with the semiconductor wafers to minimize contamination due to deposition of impurities.

Figure 2:
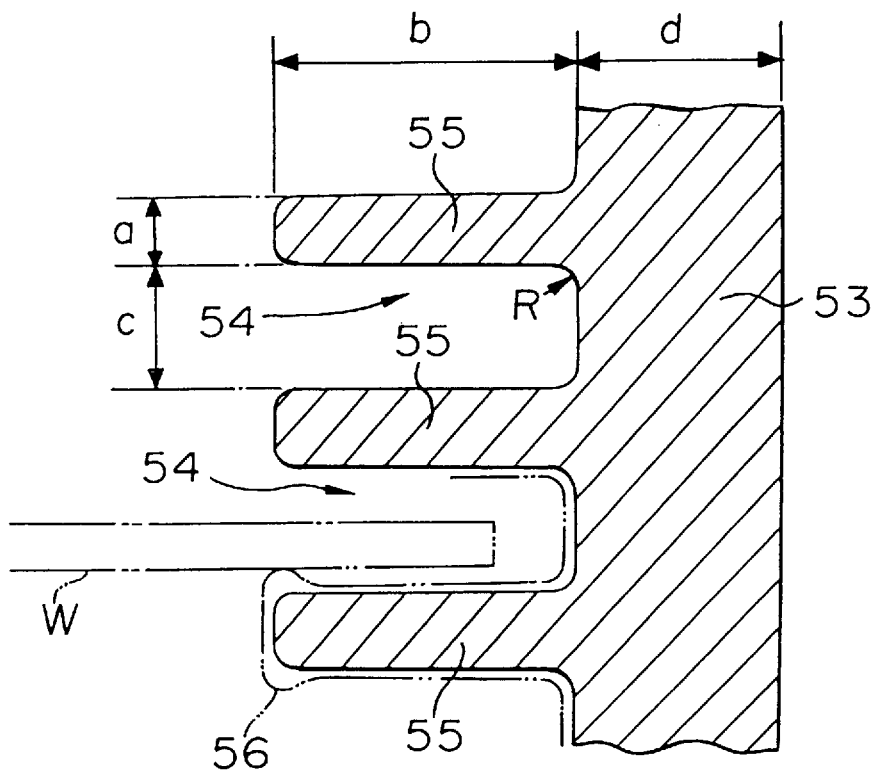
FIG. 2 is an enlarged cross-sectional view of some supporting grooves in the vertical wafer boat according to another embodiment of the present invention.

In FIG. 2, there is shown an enlarged cross-sectional view of another embodiment wherein the supporting grooves 54 of the wafer boat are formed in a different shape. In this embodiment, the supporting grooves 54 and the supporting pieces 55 have opposite sides formed in a straight manner, not a tapered manner. In this Figure, the relation among the sizes of a, b, c and d, and the value indicative of the radius are the same as those in the previous embodiment.

In the embodiment shown in FIG. 2, the supporting grooves 54 and the supporting pieces 55 have the opposite sides formed in such a straight manner. When the semiconductor wafers are inserted into the supporting grooves 54 to be supported by the supporting pieces 55, the semiconductor wafers can get in uniform touch with the supporting pieces 55 to support with the wafers with wider contacting areas, preventing the flexure of the wafers in an effective manner.

When a CVD film 56 of silicon carbide is coated on the wafer boat in the embodiment shown in FIG. 2, the thickness of the CVD film 56 is apt to become uneven, and the semiconductor wafers are sometimes difficult to get in uniform contact with the supporting pieces. In order to cope with this problem, it is preferable that the supporting grooves 54 and the supporting pieces 55 have the opposite sides tapered as shown in FIG. 1 when the CVD film is deposited on the wafer boat 50.

EXPERIMENTAL EXAMPLE 1

Slurry which was prepared by mixing 75 wt % of silicon carbide powder, 7 wt % of an organic binder of methyl cellulose, and 18 wt % of water was shaped in a gypsum mold by slip casting. After the shaped slurry dried, it is cut to obtain end plates and bars in a green body. The end plates and the bars were engaged, keeping such a green body, and an adhesive agent which was made of slurry similar to the one used for preparation of the shaped slurry was applied to coupled/joined portions between the end plates and the bars. Then, 60 minutes of firing was carried out at 2,000° C. to obtain sintered articles made of silicon carbide. Melted silicon was impregnated into the sintered silicon carbide articles according to the way as disclosed in U.S. Pat. No. 5,179,099, and supporting grooves and so on were finally machined to prepare wafer boats 50 with the straight-shaped grooves 54 shown in FIG. 2.

In the wafer boats 50, openings of 51a, 52a in the end plates 51, 52 had an inner diameter of 100 mm, and the end plates 51, 52 had an outer diameter of 210 mm and a thickness of 5 mm. The bars 53 except the engaged portions had a length of 900 mm and a thickness of 14 mm×17 mm (a cross-sectional area of 238 mm$^2$). The wafer boats had an entire length of 910 mm. The values of a, b, c, d and R in FIG. 2 were 1.7 mm, 8 mm, 3.5 mm, 6 mm and 0.5 mm, respectively. The number of the supporting grooves 54 formed in one of the bars 54 was 170.

The results which were obtained by measuring the number of fractures in machining the supporting grooves 54, and the surface roughness and the flatness after machining the supporting grooves when machining tests were carried out to 10 of the wafer boats with the radius at the corner between the bottoms of the supporting grooves 54 and the bases of the supporting pieces 55 modified one by another are shown in Table 1. Machining was carried out by use of a commercially available diamond blade with dressing done thereon. Groove machining was carried out at the respective same levels to four of the bars 53 in the respective boats.

TABLE 1

| Example | Average radius (mm) | Fracture rate of grooves | Inner wall of grooves | |
|---|---|---|---|---|
| | | | Surface roughness ($\mu$m) | Flatness (mm) |
| 1 | 0.02 (nearly right angles) | 0.86% | 125 | 0.12 |
| 2 | 0.1 | 0.16% | 58 | 0.07 |
| 3 | 0.3 | 0.02% | 22 | 0.04 |
| 4 | 0.5 | 0.00% | 5 | 0.04 |

The tables 1 indicates that when the corners between the bottoms of the supporting grooves 54 and the bases of supporting pieces 55 were rounded with a radius of not less than 0.1 mm, the fracture rate in groove machining can be extremely reduced.

EXPERIMENTAL EXAMPLE 2

Wafer boats were prepared in the same manner as the Experimental Example 1 except that groove machining was carried out to provide the tapered grooves as shown in FIG. 1.

Groove machining was carried out at a tenth of the speed in the Experimental Example 1 without providing a substantial radius at the corners between the bottom of the supporting grooves 54 and the bases of the supporting pieces 55. It was found that more than half of the grooves were fractured.

On the other hand, groove machining was carried out at a sixth of the speed in the Experimental Example 1 with a radius of 0.5 mm provided at the corners of the bottoms of the supporting grooves 54 and the bases of the supporting pieces 55. It was found that the grooves were able to machined without fracture.

As explained, in accordance with the vertical wafer boat according to the present invention, the corners between the bottoms of the wafer inserting and supporting grooves and the bases of the supporting pieces can be rounded with a radius of 0.1–1 mm not only to restrain vibration in groove machining but also to prevent stress from concentrating on the bases of the supporting pieces. As a result, the time required for machining can be shortened. Even if the supporting grooves are deepened and the distance between adjoining supporting grooves is narrowed, fracture in the supporting grooves can be avoided in machining and handling. As a result, it is possible not only to prevent the flexure of the semiconductor wafers so as to avoid dislocation by deepening the supporting grooves to obtain wide supporting areas for the wafers, but also to support numbers of the wafers by narrowing the distance between adjoining supporting grooves.

We claim:

1. A vertical wafer boat comprising:

a pair of end plates arranged at an upper position and a lower position;

a plurality of bars connecting the end plates;

supporting grooves formed in the bars at certain distances to receive and support semiconductor wafers; and comb-teeth shaped supporting pieces, each being provided between adjoining supporting grooves;

wherein the end plates, the bars, the supporting grooves and the supporting pieces are made of a material including silicon carbide as a main component, and a corner between a bottom of each of the supporting grooves and a base of the supporting piece adjoining thereto is rounded with a radius of 0.1–1 mm.

2. A vertical wafer boat according to claim 1, wherein when the supporting pieces have a thickness of a mm, and the supporting grooves have a depth of b mm and a vertical space of c mm, there is a relation of (b/a)×c>10 mm.

3. A vertical wafer boat according to claim 1, wherein when the supporting grooves have a depth of b mm, and a length which is obtained by subtracting the depth of the supporting grooves from a bar thickness is d mm, there is a relation of b>d.

4. A vertical wafer boat according to claim 1, wherein the supporting grooves have an inner wall with a surface roughness of not greater than 100 $\mu$m, or a flatness of not greater than 0.1 mm.

5. A vertical wafer boat according to claim 1, wherein the supporting pieces are formed in a tapered shape in section that provides a cone angle of $1/500$–$1/20$.

6. A vertical wafer boat according to claim 4, wherein the surface roughness of the inner wall of the supporting grooves is not greater than 30 $\mu$m.

7. A vertical wafer boat according to claim 1, wherein the corner between the bottom of the supporting groove and the base of the adjoining supporting piece is rounded with a radius of 0.2–0.7 mm.

8. A vertical wafer boat according to claim 1, wherein each of the bars has a cross-sectional area of 65–250 mm$^2$.

9. A vertical wafer boat according to claim 1, wherein the bars and the end plates have silicon impregnated thereinto.

10. A vertical wafer boat according to claim 1, wherein the bars and the end plates have surfaces coated with silicon carbide.

* * * * *